(12) United States Patent
Chiang et al.

(10) Patent No.: US 6,642,735 B2
(45) Date of Patent: Nov. 4, 2003

(54) SEMICONDUCTOR PACKAGE FOR CHIP WITH TESTING CONTACT PAD CONNECTED TO OUTSIDE

(75) Inventors: Lien-Chen Chiang, Taichung (TW); Ya-Yi Lai, Taichung Hsien (TW)

(73) Assignee: Siliconware Precision Industries Co., Ltd., Taichung Hsien (TW)

( * ) Notice: Subject to any disclaimer, the term of this patent is extended or adjusted under 35 U.S.C. 154(b) by 212 days.

(21) Appl. No.: 09/871,210

(22) Filed: May 31, 2001

(65) Prior Publication Data

US 2002/0070747 A1 Jun. 13, 2002

(30) Foreign Application Priority Data

Dec. 12, 2000 (TW) ....................................... 89126422 A

(51) Int. Cl.[7] .............................................. G01R 31/00
(52) U.S. Cl. .................................... 324/765; 324/158.1
(58) Field of Search .................................. 324/765, 763, 324/73.1, 158.1, 719; 257/690–696, 18; 438/14, 17, 18

(56) References Cited

U.S. PATENT DOCUMENTS 5,428,247 A  * 6/1995 Sohn et al. .................. 257/666
5,677,566 A  * 10/1997 King et al. ................... 257/692

* cited by examiner

*Primary Examiner*—Vinh P. Nguyen
(74) *Attorney, Agent, or Firm*—J. C. Patents

(57) ABSTRACT

A semiconductor package for chip with testing contact pad includes a chip, a plurality of leads, at least a flow-conducting plate, and a molding compound. The chip has an active surface provided with a plurality of functional contact pads and at least a testing contact pad. The leads are bonded onto the active surface of the chip and respectively connected to the functional contact pads through a plurality of functional wires. The flow-conducting plate is connected to the testing contact pad through at least a testing wire. The molding compound encapsulates the chip, the leads, the flow-conducting plate, the functional contact pads, and the testing contact pads.

16 Claims, 3 Drawing Sheets

SEMICONDUCTOR PACKAGE FOR CHIP WITH TESTING CONTACT PAD CONNECTED TO OUTSIDE

CROSS-REFERENCE TO RELATED APPLICATION

This application claims the priority benefit of Taiwan application serial no. 89126422 filed on Dec. 12, 2000.

BACKGROUND OF THE INVENTION

1. Field of the Invention

The invention relates to a semiconductor package for chip with testing contact pad. More particularly, the invention relates to a leadframe semiconductor package for chip with testing contact pad.

2. Description of the Related Art

As the era of information technology progresses, the transmission and processing of information and documents are increasingly carried out via more sophisticated and miniaturized electronic products.

As the semiconductor manufacturing enters the era of 0.18 microns, the testing of the chip is necessary to ensure the quality of the chip manufacturing process. The chip thus is usually provided with a plurality of testing contact pads thereon. The testing of the chip via the testing contact pads allows for the detection and removal of the deficient chips that are not unnecessarily packaged.

More particularly with respect to memory devices such as DRAM, the packaging structures principally used are the small-outline J-lead (SOJ) packaging structure and the thin-small outline packaging structure (TSOP). Within both above packaging structures, the leadframe arranged on the generally square-shaped chip is usually constructed with an arrangement of the leads proximate to two sides of the chip while a plurality of flow-conducting plate is located respectively on the two other sides of the chip. The flow-conducting plates maintain the uniformity of the flow of the molding compound while it is injected during the encapsulation of the chip. There are two principal types of lead arrangement in the leadframe used for the small outline J-lead (SOJ) packaging structure or the thin-small outline packaging structure (TSOP), which are the lead on chip (LOC) and the chip on lead (COL) arrangements. The lead on chip (LOC) arrangement package is principally used as DRAM packaging structure, the advantages thereof are a fast signal transmission, a good heat dissipation and a small size of the packaging structure.

Referring to FIG. 1, a top view schematically shows a conventional lead-on-chip (LOC) packaging structure. The conventional lead-on-chip (LOC) package 100 comprises a chip 110, a plurality of leads 130 and a molding compound 170. The chip 110 has an active surface 112 provided with a plurality of functional contact pads 114 and a plurality of testing contact pads 116 thereon. The testing contact pads 116 are used to test the chip 110 before it is packaged. During the mass production, the testing contact pads 116 are not connected to any leads 130. The leads 130 are respectively bonded onto two sides of the active surface 112 of the chip 110, while a pair of flow-conducting plates 150 with a plurality of flow-conducting holes 152 therein are located on the two other sides of the chip 110. The flow-conducting holes 152 uniformize the flow of the molding compound when it is injected during molding such that an excessive differential pressure between the upper and lower side of the flow conducting plates 150 can be prevented. A plurality of wires 160 connect respectively the functional contact pads 114 and the leads 130, and a molding compound 170 encapsulates the chip 110, the leads 130, the wires 160 and the flow conducting plates 150.

The above-described conventional package 100 has at least the following drawback. Because the testing contact pads 116 are encapsulated inside the molding compound 170 and are not accessible, if a deficiency of the chip appears after encapsulating, it is necessary to break the molding compound 170 and connect the testing contact pads 116 to an external testing circuit (not shown) to detect the cause of the deficiency. The decaping of the package thus performed principally consists in etching the molding compound. Such an operation is cumbersome and complicated to carry out, which is contrary to the goal of an improved productivity.

SUMMARY OF THE INVENTION

A major aspect of the present invention is to provide a semiconductor package for chip with testing contact pad in which if a deficiency of the chip appears after the chip is encapsulated, the package can be tested to detect the cause of the deficiency without breaking the molding compound.

To accomplish at least the foregoing objectives, the present invention, according to a preferred embodiment, provides a semiconductor package for chip with testing contact pad that comprises the following elements. A chip has an active surface provided with a plurality of functional contact pads and at least a testing contact pad thereon. A plurality of leads are bonded onto the active surface of the chip and respectively connected to the functional contact pads through a plurality of functional wires, each of the leads respectively extending outwardly into an outer lead. At least a flow-conducting plate has a plurality of flow-conducting holes therein and is connected to the testing contact pads through at least a testing wire, the flow-conducting plate being proximate to the testing contact pads of the chip. A molding compound encapsulates the chip, the leads, the flow-conducting plate, the functional wires and the testing wires. Specifically, the flow-conducting plates respectively extend outwardly into an outer connection member that is exposed to the outside of the package and can electrically connect to an external testing circuit.

To accomplish at least the above objectives, the present invention, according to another preferred embodiment, provides a semiconductor package for chip with testing contact pad that comprises the following elements. A chip has an active surface and a corresponding back surface, wherein the active surface of the chip has a plurality of functional contact pads and at least a testing contact pad. A die pad is bonded to the back surface of the chip. A plurality of leads are connected to the functional contact pads through a plurality of functional wires, wherein the leads extend outwardly into a plurality of outer leads. At least a flow-conducting plate has a plurality of flow conducting holes therein and is connected to the testing contact pads through at least a testing wire, wherein the flow-conducting plate is proximate to the testing contact pads of the chip. A molding compound encapsulates the chip, the die pad, the leads, the flow-conducting plates, the functional wires and the testing wire. Specifically, the flow-conducting plates respectively extend outwardly into an outer connection member that is exposed to the outside of the package and can electrically connect to an external testing circuit.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
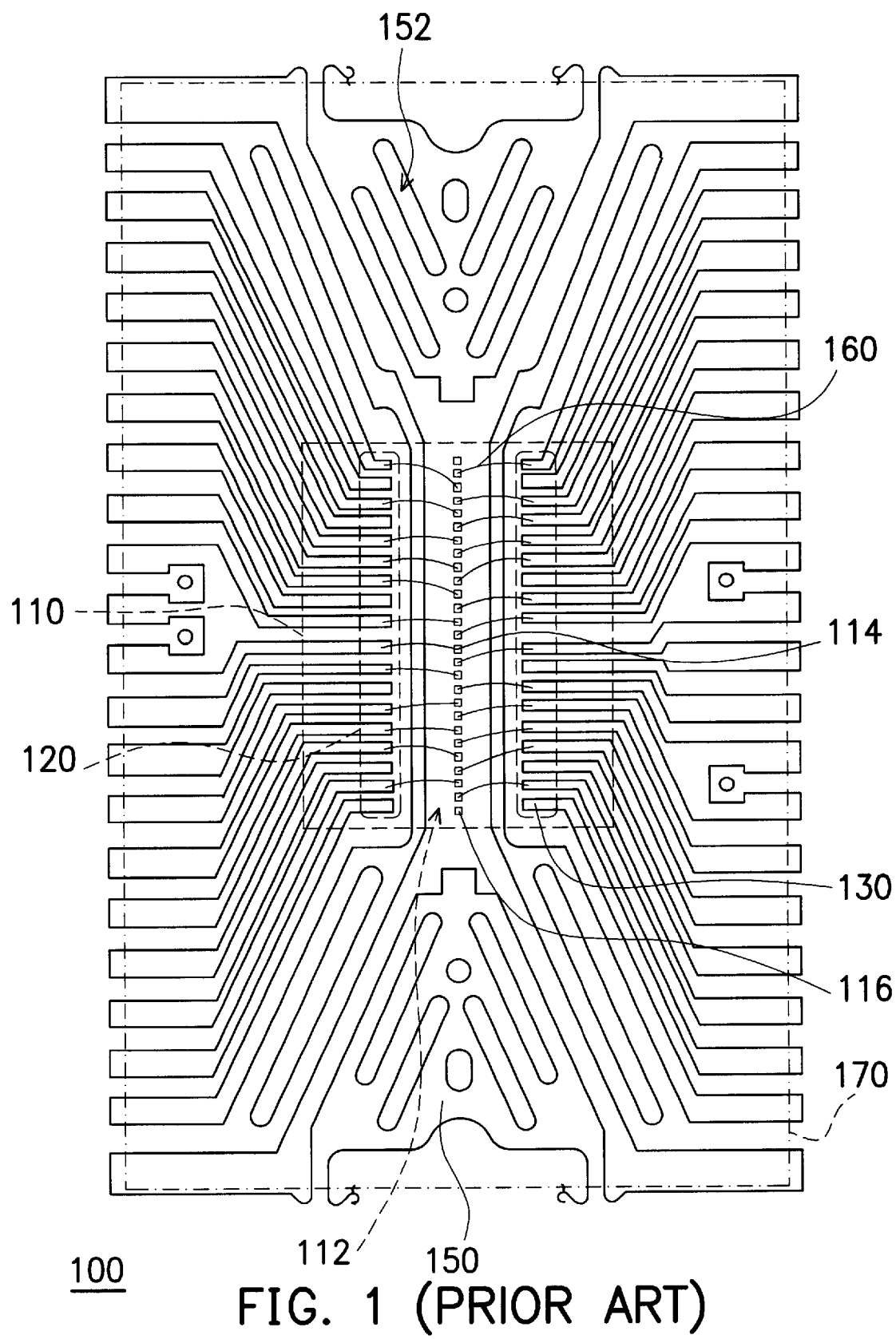
FIG. 1 is a top view schematically illustrating a conventional lead-on-chip packaging structure.
Figure 2:
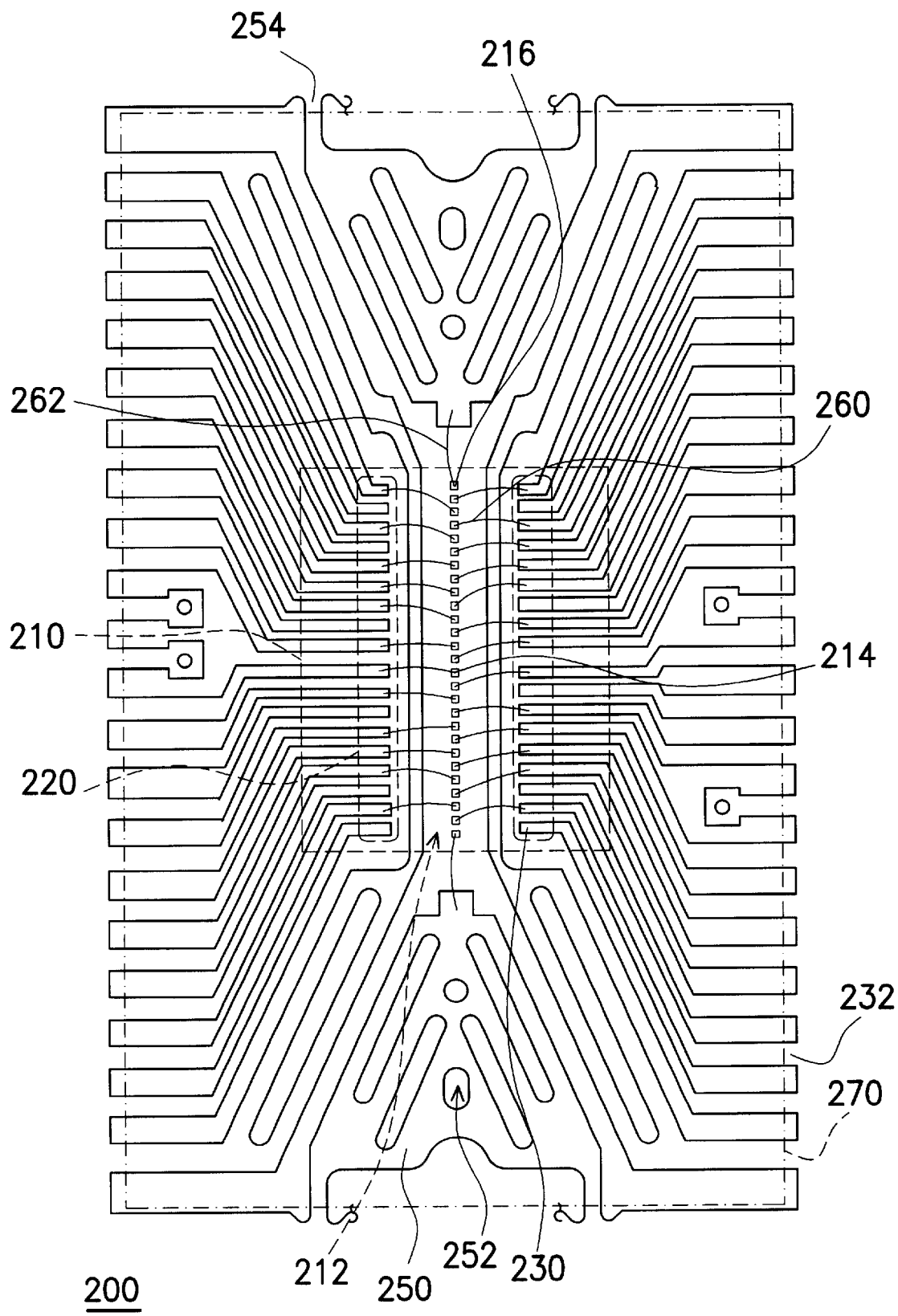
FIG. 2 is a top view schematically illustrating a semiconductor package for chip with testing contact pad according to an embodiment of the invention.

Referring now to FIG. 2, a top view schematically illustrates a semiconductor package for chip with testing contact pad according to a preferred embodiment of the present invention. In the present embodiment, a lead on chip (LOC) packaging structure is exemplary described, but the present invention also applies to other types of packaging structures. The package 200 comprises a chip 210, a plurality of leads 230, a molding compound 270 and a pair of flow-conducting plates 250. The chip 210 includes an active surface 212 provided with a plurality of functional contact pads 214 and a plurality of testing contact pads 216 thereon. The testing contact pads 216 are respectively proximate to the flow-conducting plates 250 and are used for the testing of the chip 210. During the mass production, the testing contact pads 216 are not connected to any of the leads 230. The leads 230 are bonded onto two sides of the active surface 212 of the chip 210. The pair of flow-conducting plates 250 are respectively located on two sides of the chip 210 and have a plurality of flow conducting holes 252 therein for uniformly conducting the flow of the molding compound during the encapsulating. As a result, a substantial differential pressure between the upper and lower side of the flow conducting plate 250 can be prevented.

The leads 230 respectively extend outwardly into a plurality of outer leads 232 while each of the pair of flow conducting plates 250 respectively extends outwardly into an outer connection member 254. A plurality of functional wires 260 respectively connect the functional contact pads 214 to the leads 230, while two testing wires 262 respectively connect the testing contact pads 216 to the pair of flow-conducting plates 250. The molding compound 270 encapsulates the chip 210, the leads 230, the functional wires 260, the testing wires 262 and the pair of flow-conducting plates 250, while exposing the outer leads 232 and the outer connection members 254 of the flow-conducting plates 250. The material of the functional wires 260 and the testing wires 262 is made of gold, copper, aluminum, or other conductive materials, while the molding compound can be made of, for example, epoxy.

With the above-described packaging structure, if an unusual operation appears when the semiconductor package is tested, one can directly test and detect the cause of the deficiency by connecting a testing device (not shown) to the outer connection members 254 without breaking the molding compound 270 of the semiconductor package. As a result, the material cost and manufacturing time are advantageously reduced and the conventionally cumbersome operation of breaking the molding compound can be favorably eliminated.

Figure 3:
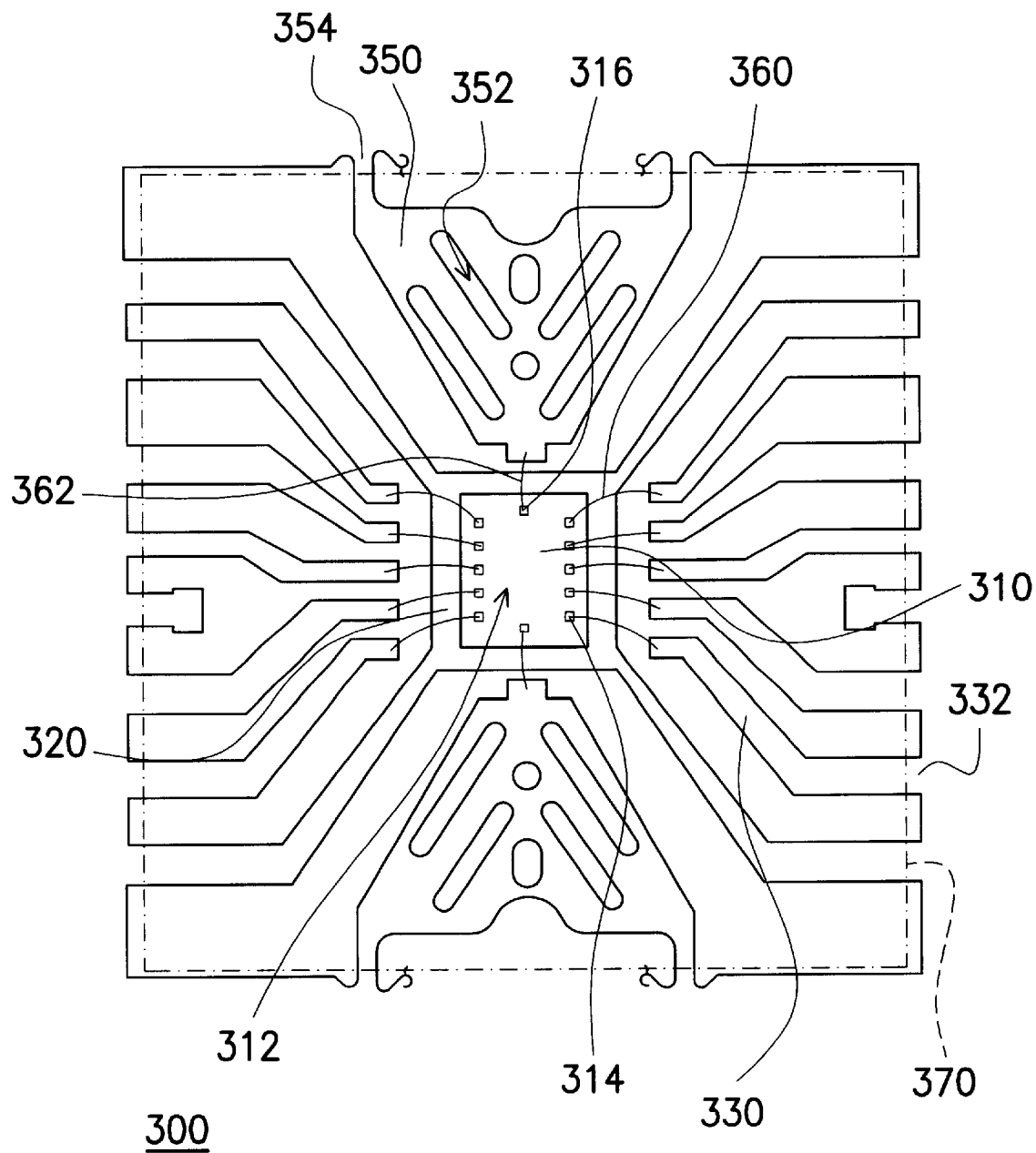
FIG. 3 is a top view schematically illustrating a semiconductor package for chip with testing contact pad according to another embodiment of the invention.

Referring to FIG. 3, a top view schematically illustrates a semiconductor package for chip with testing contact pad according to another embodiment of the invention. The benefits and advantages of the present invention such as described above are not limited to the lead-on-chip (LOC) packaging structure of the previous embodiment, but also can be obtained with other traditional packaging structures as described hereafter. A packaging structure 300 comprises a chip 310, a die pad 320, a plurality of leads 330, a plurality of flow-conducting plates 350 and a molding compound 370. The chip 310 has an active surface 312 and a corresponding back surface (not shown). The active surface 312 of the chip 310 has thereon a plurality of functional contact pads 314 proximate to the leads 330 and a plurality of testing contact pads 316 proximate to the flow-conducting plates 350. Each of the leads 330 extends outwardly into an outer lead 332, and each of the flow-conducting plates 350 has a plurality of flow-conducting holes 352 therein and extends outwardly into an outer connection member 354. The back surface (not shown) of the chip 310 is bonded onto the die pad 320. The connection of the chip 310 is via the functional wires 360 that connect respectively the functional contact pads 314 to the leads 330 on two sides of the chip 310. The testing wires 362 respectively connect the testing contact pads 316 to the flow-conducting plates 350 on both other sides of the chip 310. The molding compound 370 encapsulates the chip 310, the die pad 320, the leads 330, the functional wires 360, the testing wires 362 and the flow-conducting plates 350, while exposing the outer leads 332 and the outer connection members 354 of the flow-conducting plates 350. The material of the functional wires 360 and testing wires 362 is made of gold, copper, aluminum or other conductive materials, while the molding compound 370 is made of, for example, epoxy.

In conclusion, in accordance with the foregoing description, the invention has at least the following advantage. With the semiconductor package of the present invention, if an unusual operation appears after the chip is packaged, one can directly test and detect the cause of the deficiency by connecting a testing circuit (not shown) to the outer connection members without breaking the molding compound of the semiconductor package. As a result, the conventionally cumbersome operation of breaking the molding compound of the package can be favorably eliminated. This advantage favorably contributes to a gain of productivity by reducing the material cost and a reduction of the global manufacturing time.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A semiconductor package comprising:
    a chip having an active surface provided with a plurality of functional contact pads and at least a testing contact pad thereon;
    a plurality of leads respectively bonded onto the active surface of the chip and respectively connected to the functional contact pads through a plurality of functional wires;

at least a flow-conducting plate connected to the testing contact pad through at least a testing wire; and a molding compound encapsulating the chip, the leads, the flow-conducting plate, the functional wires and the testing wires.

2. The package of claim 1, wherein the flow-conducting plate extends outwardly into at least an outer connection member exposed to the outside of the package.

3. The package of claim 1, wherein the leads respectively extend outwardly into a plurality of outer leads exposed to the outside of the package.

4. The package of claim 1, wherein the flow-conducting plate comprises at least a flow-conducting hole.

5. The package of claim 1, wherein the testing contact pad of the chip is located proximate to the flow-conducting plate.

6. The package of claim 1, wherein the functional wires are made of gold, copper, aluminum, or alloys of such metals.

7. The package of claim 1, wherein the testing wires are made of gold, copper, aluminum, or alloys of such metals.

8. The package of claim 1, wherein the material of the molding compound is epoxy.

9. A semiconductor package comprising:

a chip having an active surface and a corresponding back surface, the active surface having a plurality of functional-contact pads and at least a testing contact pad thereon;

a die pad bonded to the back surface of the chip;

a plurality of leads respectively connected to the functional contact pads through a plurality of functional wires;

at least a flow-conducting plate connected to the testing contact pad through at least a testing wire; and a molding compound encapsulating the chip, the die pad, the leads, the flow-conducting plate, the functional wires and the testing wires.

10. The package of claim 9, wherein the flow-conducting plate extends outwardly into at least an outer connection member exposed to the outside of the package.

11. The package of claim 9, wherein the leads respectively extends outwardly into a plurality of outer leads that are exposed to the outside of the package.

12. The package of claim 9, wherein the flow-conducting plate has at least a flow-conducting hole.

13. The package of claim 9, wherein the testing contact pad of the chip is located proximate to the flow-conducting plate.

14. The package of claim 9, wherein the functional wires are made of gold, copper, aluminum, or alloys of such metals.

15. The package of claim 9, wherein the testing wire is made of gold, copper, aluminum, or alloys of such metals.

16. The package of claim 9, wherein the material of the molding compound is epoxy.

* * * * *